United States Patent
Kurihara et al.

(10) Patent No.: US 12,325,901 B2
(45) Date of Patent: Jun. 10, 2025

(54) Al WIRING MATERIAL

(71) Applicants: NIPPON MICROMETAL CORPORATION, Saitama (JP); NIPPON STEEL Chemical & Material Co., Ltd., Tokyo (JP)

(72) Inventors: Yuto Kurihara, Saitama (JP); Ryo Oishi, Saitama (JP); Motoki Eto, Saitama (JP); Daizo Oda, Saitama (JP); Tetsuya Oyamada, Tokyo (JP); Yuya Suto, Tokyo (JP); Tomohiro Uno, Tokyo (JP)

(73) Assignees: NIPPON MICROMETAL CORPORATION, Saitama (JP); NIPPON STEEL Chemical & Material Co., Ltd., Tokyo (JP)

( * ) Notice: Subject to any disclaimer, the term of this patent is extended or adjusted under 35 U.S.C. 154(b) by 348 days.

(21) Appl. No.: 17/764,872

(22) PCT Filed: Sep. 17, 2020

(86) PCT No.: PCT/JP2020/035337
§ 371 (c)(1),
(2) Date: Mar. 29, 2022

(87) PCT Pub. No.: WO2021/065551
PCT Pub. Date: Apr. 8, 2021

(65) Prior Publication Data
US 2022/0341004 A1 Oct. 27, 2022

(30) Foreign Application Priority Data
Oct. 1, 2019 (JP) .................................. 2019-181187

(51) Int. Cl.
C22C 21/00 (2006.01)
C21D 8/06 (2006.01)
C22C 16/00 (2006.01)
C22C 19/03 (2006.01)
C22C 28/00 (2006.01)

(52) U.S. Cl.
CPC ................ *C22C 21/00* (2013.01); *C21D 8/06* (2013.01); *C22C 16/00* (2013.01); *C22C 19/03* (2013.01); *C22C 28/00* (2013.01)

(58) Field of Classification Search
CPC ......... C22C 21/00; C22C 16/00; C22C 19/03; C22C 28/00; C21D 8/06; H01L 2224/43; H01L 2224/44; H01L 2224/45; H01L 2224/45124
See application file for complete search history.

(56) References Cited

U.S. PATENT DOCUMENTS

| | | | |
|---|---|---|---|
| 9,312,235 B1 | 4/2016 | Kang et al. | |
| 9,397,064 B2 | 7/2016 | Milke et al. | |
| 2006/0093512 A1 | 5/2006 | Pandey | |
| 2010/0183869 A1 | 7/2010 | Lin et al. | |
| 2014/0224523 A1 | 8/2014 | In et al. | |
| 2015/0303165 A1 | 10/2015 | Milke et al. | |
| 2016/0358685 A1* | 12/2016 | Yoshida | C22C 21/00 |
| 2018/0254118 A1 | 9/2018 | Nishi et al. | |

FOREIGN PATENT DOCUMENTS

| | | | | |
|---|---|---|---|---|
| CN | 102333897 A | | 1/2012 | |
| CN | 103320654 A | | 9/2013 | |
| CN | 104937672 A | | 9/2013 | |
| CN | 106521250 A | | 3/2017 | |
| CN | 108538426 A | | 9/2018 | |
| CN | 109457145 A | | 3/2019 | |
| JP | 2001348637 A | * | 12/2001 | |
| JP | 2002-314038 A | | 10/2002 | |
| JP | 2004-218090 A | | 8/2004 | |
| JP | 2014047417 A | * | 3/2014 | ............. H01L 24/43 |
| JP | 2014-129578 A | | 7/2014 | |
| JP | 2016-511529 A | | 4/2016 | |
| JP | 2016-152316 A | | 8/2016 | |
| RU | 2663446 C1 | | 8/2018 | |
| SG | 2013030143 A | | 4/2014 | |

OTHER PUBLICATIONS

JP-2001348637-A english (Year: 2001).*
International Search Report issued in corresponding International Patent Application No. PCT/JP2020/035337, dated Dec. 1, 2020, with English translation.
Extended European Search Report issued in corresponding European Patent Application No. 20873056.4, dated Aug. 14, 2023.
"Standard Practice for Using Significant Digits in Test Date to Determine Conformance with Specifications," ASTM International, Designation: E:29-13, 5 pages (2013), at http://www.galvanizeit.com/uploads/ASTM-E-29-yr-13.pdf.
Singaporean Written Opinion and Search Report issued in corresponding Singapore Patent Application No. 11202203260R on Feb. 21, 2023.
Office Action dated Apr. 12, 2024, from corresponding TW Application No. 109133771, 12 pages.
Office Action has been issued in the corresponding Chinese Patent Application No. 202080069219.0 on Feb. 28, 2025.

* cited by examiner

Primary Examiner — Ricardo D Morales
(74) Attorney, Agent, or Firm — Rimon P.C.

(57) ABSTRACT

There is provided an Al wiring material which suppresses a chip crack and achieves thermal shock resistance while suppressing lowering of a yield at the time of manufacture. The Al wiring material contains at least Sc and Zr so as to satisfy $0.01 \leq x1 \leq 0.5$ and $0.01 \leq x2 \leq 0.3$ where x1 is a content of Sc [% by weight] and x2 is a content of Zr [% by weight], with the balance comprising Al.

8 Claims, No Drawings ized are often used as semiconductor devices for large power equipment such as air conditioners and photovoltaic power generation systems, and for automotive. In these semiconductor devices, the bonded parts of wiring material are exposed to high temperatures of 150° C. or more at the time when the device operates. When using a material composed only of high purity Al as the wiring material, softening of the wiring material tends to proceed in such a temperature environment at the time when the device operates, and it is difficult to use such wiring material in a high temperature environment.

AI WIRING MATERIAL

CROSS REFERENCE TO RELATED APPLICATIONS

This application is the U.S. National Phase under 35 US.C. § 371 of International Application No. PCT/JP2020/035337, filed on Sep. 17, 202, which claims the benefit of Japanese Patent Application No. 2019-181187, filed on Oct. 1, 2019, the entire contents of each are hereby incorporated by reference.

TECHNICAL FIELD

The present invention relates to an Al wiring material. The present invention further relates to a semiconductor device including the Al wiring material.

BACKGROUND ART

In a semiconductor device, electrodes formed on a semiconductor element are connected with lead frames or electrodes on a substrate using a bonding wire or a boding ribbon (hereinafter also collectively referred to as "wiring material"). In a power semiconductor device, a wiring material made of aluminum (Al) (hereinafter also simply referred to as an "Al wiring material") is mainly used. For example, Patent Literature 1 discloses an example of using an Al bonding wire with a diameter of 300 μm in a power semiconductor module. In the power semiconductor device using the Al wiring material, wedge bonding is used as a bonding process for both of first connection with electrodes on a semiconductor chip and second connection with lead frames or electrodes on a substrate.

Power semiconductor devices using Al wiring materials are often used as semiconductor devices for large power equipment such as air conditioners and photovoltaic power generation systems, and for automotive. In these semiconductor devices, the bonded parts of wiring material are exposed to high temperatures of 150° C. or more at the time when the device operates. When using a material composed only of high purity Al as the wiring material, softening of the wiring material tends to proceed in such a temperature environment at the time when the device operates, and it is difficult to use such wiring material in a high temperature environment.

There has been developed an Al wiring material made of a material obtained by adding a specific element to Al. For example, Patent Literature 2 discloses an Al bonding wire the mechanical strength of which is improved by adding scandium (Sc) of 0.05 to 1% by weight to Al to be precipitation-hardened. Patent Literature 3 discloses that an Al wiring material containing one or more of nickel (Ni), silicon (Si), and phosphorus (P), the amount of which is 800 ppm by weight or less in total, has favorable bonding strength and weather resistance. Patent Literature 4 discloses an Al bonding wire containing 0.01 to 0.2% by weight of iron (Fe) and 1 to 20 ppm by weight of Si in which a solid solution amount of Fe is 0.01 to 0.06% by weight, a precipitation amount of Fe is seven times or less the solid solution amount, and an average crystal grain diameter is 6 to 12 μm, and describes that this wire has favorable bonding reliability.

RELATED ART REFERENCE

Patent Literature

Patent Literature 1: JP-A-2002-314038
Patent Literature 2: JP-A-2016-511529
Patent Literature 3: JP-A-2016-152316
Patent Literature 4: JP-A-2014-129578

SUMMARY OF INVENTION

Problem to be Solved by the Invention

In power semiconductor devices the temperature of which greatly changes in accordance with an operation cycle of the device, a shocking thermal stress may be caused in accordance with a temperature change (hereinafter such a phenomenon is also referred to as "thermal shock"), and a connection part between the Al wiring material and a member to be connected and the like may be damaged. Specifically, in accordance with a temperature change following the operation cycle, a crack due to a difference between coefficients of thermal expansion of the Al wiring material and the member to be connected may be caused at an interface of the connection part (hereinafter such a phenomenon is also referred to as "bond crack"). In the power semiconductor devices, a crack due to a bending stress caused by expansion and contraction of the Al wiring material itself may also be caused at a loop rising part in the vicinity of the connection part (hereinafter such a phenomenon is also referred to as "heel crack"). The bond crack or the heel crack develops with corrosion in an environment at the time when the device operates, the Al wiring material finally comes off from the member to be connected or the like, and the bonding reliability is then deteriorated in some cases.

On the other hand, as a method of suppressing softening of the Al wiring material in a high-temperature environment, there is a method of adding another element to the Al wiring material to suppress coarsening of crystal grains, and increasing the strength of the Al wiring material. It is effective to add an element such as Sc, Ni, or Fe to the Al wiring material to suppress coarsening of crystal grains. However, as the content of these elements increases, a yield may be lowered because the wire breakage or damage occurs at the time of manufacturing the Al wiring material, or a member to be connected may be damaged at the time of connecting the Al wiring material to the member to be connected (hereinafter such a phenomenon is also referred to as a "chip crack"). When an intermetallic compound formed between such an added element and Al is condensed and coarsened, an adverse effect may be caused on the generation and development of the bond crack or the heel crack (that is, the generation and development of the crack is accelerated).

There have been reported some Al wiring materials the strength of which is increased by adding another element to Al. However, there is room for improvement in suppressing a chip crack and achieving resistance to thermal shock following an operation cycle of the device (hereinafter also simply referred to as "thermal shock resistance") while suppressing lowering of a yield at the time of manufacture.

An object of the present invention is to provide an Al wiring material which can suppress a chip crack and achieve thermal shock resistance while suppressing lowering of a yield at the time of manufacture.

Means for Solving Problem

As a result of earnest investigation as to the problem described above, the present inventors have found that the problem described above can be solved by the Al wiring material having the configuration described below, and further investigated the problem based on such knowledge to complete the present invention.

That is, the present invention includes the following content.

[1] An Al wiring material containing at least Sc and Zr so as to satisfy $0.01 \leq x1 \leq 0.5$, and $0.01 \leq x2 \leq 0.3$ where x1 is a content of Sc [% by weight] and x2 is a content of Zr [% by weight], with the balance comprising Al.

[2] The Al wiring material according to [1], further containing Ni so as to satisfy $10 \leq x3 \leq 500$ where x3 is a content of Ni [ppm by weight].

[3] The Al wiring material according to [1] or [2], wherein x1 and x2 satisfy a relation of x2/x1>0.5.

[4] The Al wiring material according to any one of [1] to [3], wherein Vickers hardness of a longitudinal axis part of the Al wiring material is 40 Hv or less.

[5] The Al wiring material according to any one of [1] to [4], wherein the Al wiring material has been subjected to a thermal refining heat treatment at 580 to 640° C. for 30 seconds or less.

[6] The Al wiring material according to any one of [1] to [5], wherein the Al wiring material does not have a coating that contains a metal other than Al as a main component.

[7] The Al wiring material according to any one of [1] to [6], wherein the Al wiring material is a bonding wire.

[8] The Al wiring material according to any one of [1] to [7], wherein the Al wiring material is subjected to an aging heat treatment at 250 to 400° C. for 30 to 60 minutes after being connected to a member to be connected.

[9] A semiconductor device comprising the Al wiring material according to any one of [1] to [8].

Effect of the Invention

The present invention can provide an Al wiring material which can suppress a chip crack and achieve thermal shock resistance while suppressing lowering of a yield at the time of manufacture.

EMBODIMENT FOR CARRYING OUT THE INVENTION

Hereinafter, the present invention will be described in detail based on a preferred embodiment thereof.

[Al Wiring Material]

An Al wiring material according to the present invention contains at least scandium (Sc) and zirconium (Zr) so as to satisfy $0.01 \leq x1 \leq 0.5$ and $0.01 \leq x2 \leq 0.3$ where x1 is the content of Sc [% by weight] and x2 is the content of Zr [C by weight].

Sc raises a recrystallization temperature of the Al wiring material, and contributes to suppressing coarsening of crystal grains and maintaining the strength of the Al wiring material even when a semiconductor device is continuously used in a high-temperature environment. Coarsening of crystal grains tends to be suppressed in the high-temperature environment as an addition amount of Sc is increased. However, as described above, when the addition amount of Sc is increased, a yield may be lowered because the wire breakage or damage occurs at the time of manufacturing the Al wiring material, or a chip crack may be generated at the time of connecting the Al wiring material to a member to be connected. Additionally, when an intermetallic compound formed between Sc and Al is condensed and coarsened, an adverse effect may be caused on the generation and development of a bond crack or a heel crack (that is, the generation and development of the crack is accelerated). On the other hand, the Al wiring material according to the present invention containing 0.01 to 0.5% by weight of Sc and 0.01 to 0.3% by weight of Zr may have appropriate strength and hardness before connection of the Al wiring material, and may suppress lowering of the yield at the time of manufacture and suppress the generation of chip crack at the time of connection while keeping an effect of Sc such that coarsening of crystal grains may be suppressed in a high-temperature environment. Additionally, the Al wiring material according to the present invention can suppress the condensation/coarsening of the intermetallic compound of Al and Sc, and can greatly suppress the generation and development of a bond crack or a heel crack in use for a power semiconductor device the temperature of which greatly changes in accordance with an operation cycle of the device. In this way, the Al wiring material according to the present invention suppresses a chip crack and achieves thermal shock resistance, while suppressing lowering of a yield at the time of manufacture, and greatly contributes to the improvement of long-term operation reliability of the semiconductor device the temperature of which greatly changes in accordance with the operation cycle of the device.

—Sc (First Element)—

The Al wiring material according to the present invention contains, as a first element, Sc in a range from 0.01 to 0.5% by weight. That is, it satisfies $0.01 \leq x1 \leq 0.5$ where x1 is the content of Sc [% by weight] in the Al wiring material.

From a viewpoint of suppressing coarsening of crystal grains in a high-temperature environment and maintaining the strength of the Al wiring material, the content of Sc in the Al wiring material, that is, x1 is 0.01% by weight or more, and is preferably 0.02% by weight or more, 0.03% by weight or more, 0.04% by weight or more, or 0.05% by weight or more.

From a viewpoint of suppressing lowering of a yield at the time of manufacture and a chip crack at the time of connection, an upper limit of the content of Sc, x1, is 0.5% by weight or less, and is preferably 0.48% by weight or less, 0.46% by weight or less, 0.45% by weight or less, 0.44% by weight or less, 0.42% by weight or less, or 0.4% by weight or less.

—Zr (Second Element)—

The Al wiring material according to the present invention contains, as a second element, Zr in a range from 0.01 to 0.3% by weight. That is, it satisfies $0.01 \leq x2 \leq 0.3$ where x2 is the content of Zr [% by weight] in the Al wiring material.

By containing Zr in combination with Sc, the Al wiring material according to the present invention can suppress a chip crack and achieve thermal shock resistance while suppressing lowering of the yield at the time of manufacture. Focusing only on improvement of the strength of the Al wiring material, the strength may be improved in some degree even in a case of singly containing Sc or a case of singly containing Zr. However, suppression of a chip crack and thermal shock resistance are specifically achieved at an especially high level in a case of containing Sc and Zr in combination.

From a viewpoint of achieving especially excellent thermal shock resistance in combination with Sc, the content of Zr in the Al wiring material, that is, x2 is 0.01% by weight or more, and is preferably 0.02% by weight or more, 0.03% by weight or more, 0.04% by weight or more, or 0.05% by weight or more.

From a viewpoint of suppressing lowering of the yield at the time of manufacture and a chip crack at the time of connection, an upper limit of the content of Zr, x2, is 0.3% by weight or less, and is preferably 0.28% by weight or less, 0.26% by weight or less, 0.25% by weight or less, 0.24% by weight or less, 0.22% by weight or less, or 0.2% by weight or less.

A ratio x2/x1 between the content x1 [% by weight] of Sc and the content x2 [% by weight] of Zr is not particularly limited so long as each of x1 and x2 falls within the preferred range described above, and the range may be 0.05 or more, 0.1 or more, or 0.2 or more, for example. From a viewpoint of implementing the Al wiring material which achieves excellent thermal shock resistance especially for a long term, x1 and x2 preferably satisfy a relation of x2/x1>0.5, and more preferably satisfy a relation of x2/x1≥0.55, x2/x1≥0.6, x2/x1≥0.65, x2/x1≥0.7, x2/x1≥0.75, or x2/x1≥0.8. An upper limit of the x2/x1 ratio is not limited so long as each of x1 and x2 falls within the preferred range described above. However, from a viewpoint of easily implementing the Al wiring material having desired strength in a high-temperature environment, the upper limit of the x2/x1 ratio may be preferably 10 or less (that is, 10≥x2/x1), 8 or less, 6 or less, or 5 or less. When the x2/x1 ratio falls within the preferred range described above, more benefit can be obtained from the effect described above especially in a case in which 0.15<x1 is satisfied.

—Ni (Third Element)—

The Al wiring material according to the present invention may further contain Ni. By containing Ni in addition to Sc and Zr, corrosion resistance may be improved, coarsening of crystal grains in a high-temperature environment can be further suppressed, and the strength of the Al wiring material can be maintained at a high level.

The content of Ni in the Al wiring material may fall within a range from 10 to 500 ppm by weight. That is, it may satisfy 10≤x3≤500 where x3 is the content of Ni [ppm by weight] in the Al wiring material.

From a viewpoint of achieving excellent corrosion resistance, suppressing coarsening of crystal grains in a high-temperature environment, and maintaining the strength of the Al wiring material, the content of Ni in the Al wiring material, that is, x3 is preferably 10 ppm by weight or more, and more preferably, 15 ppm by weight or more, 20 ppm by weight or more, 25 ppm by weight or more, or 30 ppm by weight or more.

From a viewpoint of suppressing lowering of the yield at the time of manufacture and a chip crack at the time of connection, an upper limit of the content of Ni, x3, is preferably 500 ppm by weight or less, and more preferably, 450 ppm by weight or less, 400 ppm by weight or less, 350 ppm by weight or less, 300 ppm by weight or less, 250 ppm by weight or less, 200 ppm by weight or less, 150 ppm by weight or less, or 100 ppm by weight or less.

The balance, the remaining part, of the Al wiring material according to the present invention contains Al. As an aluminum raw material for manufacturing the Al wiring material, aluminum having purity equal to or higher than 5N (Al: 99.999% by weight or more) is preferably used. In a range of not inhibiting the effect of the present invention, the balance of the Al wiring material according to the present invention may contain an element other than Al. The content of Al in the balance of the Al wiring material according to the present invention is not limited so long as the content does not inhibit the effect of the present invention, and is preferably 98% by weight or more, 98.5% by weight or more, 99% by weight or more, 99.5% by weight or more, 99.6% by weight or more, 99.7% by weight or more, 99.8% by weight or more, or 99.9% by weight or more. According to a preferred embodiment, the balance of the Al wiring material according to the present invention consists of Al and inevitable impurities.

Hereinafter, there will be described an especially preferred embodiment of the Al wiring material which can suppress a chip crack and achieve thermal shock resistance at a high level while suppressing lowering of the yield at the time of manufacture.

In an especially preferred embodiment, the Al wiring material according to the present invention contains Sc and Zr so as to satisfy 0.01≤x1<0.15 and 0.01≤x2≤0.3 where x1 is the content of Sc [% by weight] and x2 is the content of Zr [% by weight], with the balance consisting of Al and inevitable impurities. Hereinafter, this embodiment is also referred to as a "first embodiment".

In another especially preferred embodiment, the Al wiring material according to the present invention contains Sc, Zr, and Ni so as to satisfy 0.01≤x1<0.15, 0.01≤x2≤0.3, and 10≤x3≤500 where x1 is the content of Sc [% by weight], x2 is the content of Zr [% by weight], and x3 is the content of Ni [ppm by weight], with the balance consisting of Al and inevitable impurities. Hereinafter, this embodiment is also referred to as a "second embodiment".

In yet another especially preferred embodiment, the Al wiring material according to the present invention contains Sc and Zr so as to satisfy 0.15≤x1≤0.5 and 0.01≤x2≤0.3 where x1 is the content of Sc [% by weight] and x2 is the content of Zr [% by weight], with the balance consisting of Al and inevitable impurities. Hereinafter, this embodiment is also referred to as a "third embodiment".

In yet another especially preferred embodiment, the Al wiring material according to the present invention contains Sc, Zr, and Ni so as to satisfy 0.15≤x1≤0.5, 0.01≤x2≤0.3, and 10≤x3≤500 where x1 is the content of Sc [% by weight], x2 is the content of Zr [% by weight], and x3 is the content of Ni [ppm by weight], with the balance consisting of Al and inevitable impurities. Hereinafter, this embodiment is also referred to as a "fourth embodiment".

From a viewpoint of implementing the Al wiring material that achieves excellent thermal shock resistance especially for a long term, the content x1 [% by weight] of Sc and the content x2 of Zr preferably satisfy a relation of x2/x1>0.5 in the third and the fourth embodiments, especially in the third embodiment. A preferred range of the ratio x2/x1 is described above.

The content of Sc, Zr, Ni, and the like in the Al wiring material can be measured by using a method in "Measurement of element content" described later.

The Al wiring material according to the present invention may have a coating that contains a metal other than Al as a main component on an outer periphery of the Al wiring material, or does not necessarily have the coating. In a preferred embodiment, the Al wiring material according to the present invention does not have a coating that contains a metal other than Al as a main component on the outer periphery of the Al wiring material. Herein, the "coating that contains a metal other than Al as a main component" means the coating in which the content of the metal other than Al is 50% by weight or more.

The Al wiring material according to the present invention may be an Al bonding wire, or an Al bonding ribbon. In a case in which the Al wiring material according to the present invention is the Al bonding wire, a wire diameter thereof is not particularly limited, and may be 50 to 600 µm, for example. In a case in which the Al wiring material according to the present invention is the Al bonding ribbon, dimensions (w×t) of a rectangular or a substantially rectangular cross section thereof are not particularly limited, and w may be 100 to 3000 µm, and t may be 50 to 600 µm, for example.

A manufacturing method for the Al wiring material according to the present invention is not particularly limited. For example, the Al wiring material according to the present invention may be manufactured by using a known processing method such as extrusion processing, swaging processing, wire-drawing processing, and rolling processing, for example. For example, after measuring an aluminum raw material and raw materials such as Sc, Zr, and Ni (if contained) as a starting material so that the content of Sc, Zr, and Ni (if contained) falls within the specific range described above, these materials are molten and mixed to obtain an ingot. Alternatively, as the raw materials such as Sc, Zr, and Ni, a mother alloy containing these elements may be used. The Al wiring material can be formed by processing the ingot to have final dimensions. The Al wiring material according to the present invention in which the content of Sc, Zr, and Ni (if contained) falls within the specific range described above can be manufactured (processed) while suppressing the wire breakage or damage to a level not interfering with mass production.

In the middle of processing or after the processing end, the solution heat treatment is preferably performed to form solid solution of Sc, Zr, Ni (if contained), and the like. A condition for the solution heat treatment may be, for example, 30 minutes to 3 hours at 570 to 640° C. In a case in which x2 satisfies $0.01 \leq x2 \leq 0.15$ in the first and the second embodiments described above, all of Sc, Zr, and the like can be caused to be solid solution at the time of manufacturing the ingot, so that the solution heat treatment is not necessarily performed.

The following further describes manufacture of the Al bonding wire.

After the processing end, and if the solution heat treatment described above is performed, at the following stage, a thermal refining heat treatment for softening the wire is performed. The thermal refining heat treatment may be additionally performed in the middle of the processing. A crystal structure of the wire is changed from a processed structure to a recrystallized structure by the thermal refining heat treatment. Thus, the crystal structure is changed to the recrystallized structure, so that softening of the wire can be achieved. Regarding a temperature condition for the thermal refining heat treatment, for example, the tensile strength of a thermally refined wire may be checked by changing only a temperature inside a furnace at a fixed wire feeding speed, and a heat treatment temperature may be determined so that the tensile strength falls within a range from 60 to 140 MPa. The heat treatment temperature may fall within a range from 580 to 640° C., for example. In a preferred embodiment, a time of the thermal refining heat treatment is 30 seconds or less (more preferably, 25 seconds or less, or 20 seconds or less). By performing the thermal refining heat treatment for such a short time, even in a case in which the content of Sc is relatively high as in the third and the fourth embodiments described above, the crystal structure can be changed to the recrystallized structure without precipitation of the intermetallic compound.

Regarding the Al wiring material according to the present invention, preferably, by performing the solution treatment in a manufacturing process thereof, Sc, Zr, Ni (if contained), and the like, and an intermetallic compound thereof are not precipitated. Thus, regarding the Al wiring material according to the preferred embodiment, when the total content of Sc and Zr in the Al wiring material is defined as 100% by weight, the total amount of Sc and Zr present in a phase separated from Al, as an intermetallic compound phase, is preferably 5% by weight or less, and more preferably, 4% by weight or less, 3% by weight or less, 2% by weight or less, or 1% by weight or less. Regarding the Al wiring material, the total amount of Sc and Zr present in the intermetallic compound phase can be measured by a chemical analysis of electrolytic extraction residue of the Al wiring material.

By causing Sc and Zr to be solid solution, and causing the crystal structure to be the recrystallized structure, the Al wiring material exhibits appropriate hardness. In the Al wiring material according to the present invention, Vickers hardness of a longitudinal axis part thereof (an axis part in a longitudinal direction; that is, a center part of the Al wiring material) is 40 Hv or less. Herein, the longitudinal axis of the Al wiring material means a center axis of the Al wiring material in a case in which the Al wiring material is an Al bonding wire, and means a center axis satisfying the center of w and the center of t in a case in which the Al wiring material is an Al bonding ribbon having a rectangular or a substantially rectangular cross section (w×t). The Al wiring material according to the present invention has such appropriate hardness at the time of being connected to the member to be connected, and can thereby suppress the generation of chip crack. The Vickers hardness of the Al wiring material can be measured by using a method in "Measurement of Vickers hardness" described later.

In the Al wiring material according to the present invention, an average crystal grain diameter at a cross section (C cross section) perpendicular to a wire longitudinal direction is preferably 1 to 50 µm. If the average crystal grain diameter is 1 µm or more, recrystallization by the thermal refining heat treatment at the time of processing is appropriately proceeding. Additionally, a contained component is forcibly caused to be solid solution by performing the solution heat treatment at the manufacturing process of the Al wiring material, so that the Al wiring material is softened, and it is possible to prevent a chip crack from being generated at the time of bonding and prevent a bond quality of the connection part from being deteriorated. On the other hand, the average crystal grain diameter exceeding 50 µm indicates that recrystallization of the Al wiring material is excessively proceeding, and the reliability of the connection part may be lowered. By performing the thermal refining heat treatment in a process of the processing, the average crystal grain diameter at the C cross section of the Al wiring material can be easily caused to be 1 to 50 µm. The average crystal grain diameter is assumed to be an average diameter in a case of obtaining areas of respective crystal grains by using a measuring method such as Electron Back Scatter Diffraction (EBSD) Patterns, and regarding the area of each crystal grain as a circle. The average crystal grain diameter at the C cross section of the Al wiring material can be measured by using a method in "Measurement of average crystal grain diameter at C cross section" described later.

A specific resistance of the Al wiring material according to the present invention is preferably 3.6 µΩ·cm or less. When the Al wiring material according to the present invention is subjected to heat treatment at 300° C. for 30 minutes, the specific resistance thereof is preferably 3.0 µΩ·cm or less. The Al wiring material according to the present invention has such a low specific resistance, so that it is possible to reduce a heating amount at the time when the device operates, and to suppress (1) the recrystallization and softening of the Al wiring material, and (2) the generation and development of a crack. Accordingly, bonding reliability may be secured even when the semiconductor device operates for a long term. The specific resistance of the Al wiring material can be measured by using a DC 4-terminal measurement method. For example, the specific resistance of the Al wiring material can be measured by using RM3544-01 manufactured by HIOKI E.E. CORPORATION as a resistance meter under the condition that a sample length is 400 mm and a measuring current is 1 mA. The number of times of measurement is five, and an arithmetic mean value thereof can be obtained as a specific resistance value of each sample.

The Al wiring material according to the present invention exhibits appropriate strength by containing the specific amount of Sc, Zr, Ni (if contained), and the like, and by solid-solution strengthening and working of structure control by heat treatment in the manufacturing process for the wiring material. For example, the Al wiring material according to the present invention may exhibit the breaking strength from 50 to 130 MPa. The breaking strength of the Al wiring material can be measured by using a method in "Measurement of mechanical properties" described later.

Regarding connection between the Al wiring material according to the present invention and the member to be connected, both of first connection with an electrode on a semiconductor chip and second connection with a lead frame or an electrode on a circuit board (also simply referred to as a "substrate") are performed by wedge bonding. After connection with the member to be connected, aging heat treatment is preferably performed on the semiconductor device including the Al wiring material. As a result of the aging heat treatment, Sc and Zr in the Al wiring material form an intermetallic compound $Al_3(Sc_x, Zr_{1-x})$ (where x satisfies $0<x<1$. The same applies to the following) with Al, and a fine phase of the intermetallic compound is precipitated. As a result of the fine phase formed in the Al wiring material, the Al wiring material is precipitation-strengthened, and the strength thereof is increased. An aging heat treatment condition is not particularly limited so long as the fine phase of the intermetallic compound $Al_3(Sc_x, Zr_{1-x})$ may be formed, but is preferably 250 to 400° C. and 30 to 60 minutes, for example. In a case of singly adding each of Sc and Zr to the Al wiring material, for example, each of $Al_3Sc$ and $Al_3Zr$ is formed as the intermetallic compound. Fine phases of these $Al_3Sc$ and $Al_3Zr$ also exhibit an effect of increasing the strength of the Al wiring material by precipitation strengthening. However, the present inventors have found that the speed of condensation and coarsening is significantly low in the fine phase of $Al_3(Sc_x, Zr_{1-x})$ as compared with the fine phases of $Al_3Sc$ and $Al_3Zr$, and the fine phase of $Al_3(Sc_x, Zr_{1-x})$ may significantly suppress coarsening of crystal grains of Al (a matrix phase), so that particularly excellent thermal shock resistance can be achieved for a long term.

Thus, the present invention also provides a manufacturing method for the semiconductor device. In a preferred embodiment, the manufacturing method for the semiconductor device according to the present invention includes:

(A) a step of connecting the electrode on the semiconductor chip to the lead frame or the electrode on the substrate via the Al wiring material according to the present invention; and (B) a step of performing the aging heat treatment after the connection via the Al wiring material.

As the semiconductor chip, the lead frame, or the substrate used at the step (A), known components that may be used for constituting the semiconductor device may be used as described later. Details and preferred aspects of the Al wiring material according to the present invention used at the step (A) are as described above. At the step (A), both of the first connection with the electrode on the semiconductor chip and the second connection with the lead frame or the electrode on the substrate are performed by wedge bonding.

At the step (B), Sc and Zr in the Al wiring material form the intermetallic compound $Al_3(Sc_x, Zr_{1-x})$ with Al, and the fine phase of the intermetallic compound is precipitated.

[Semiconductor Device]

The semiconductor device can be manufactured by connecting the electrode on the semiconductor chip to the lead frame or the electrode on the circuit board by using the Al wiring material according to the present invention.

The semiconductor device according to the present invention includes the Al wiring material according to the present invention. The Al wiring material according to the present invention suppresses a chip crack and achieves thermal shock resistance while suppressing lowering of the yield at the time of manufacture, and the semiconductor device including the Al wiring material may achieve excellent operation reliability even in a case in which the temperature greatly changes in accordance with the operation cycle of the device.

In one embodiment, the semiconductor device according to the present invention includes the circuit board, the semiconductor chip, and the Al wiring material for bringing the circuit board and the semiconductor chip into conduction with each other, and is characterized in that the Al wiring material is the Al wiring material according to the present invention. It should be noted that the "Al wiring material according to the present invention" related to the semiconductor device according to the present invention encompasses a case in which at least some part of Sc, Zr, Ni (if contained), and the like forms an intermetallic compound with Al so long as the content of Sc, Zr, Ni (if contained), and the like falls within the preferred range described above. With the semiconductor device according to the present invention, the total amount of Sc and Zr present in the phase separated from Al, as an intermetallic compound phase, can be maintained within a preferred range even in a case in which the semiconductor device is operated for a long time in a high-temperature environment, and the intermetallic compound can be maintained as the fine phase.

In the semiconductor device according to the present invention, the circuit board and the semiconductor chip are not particularly limited, and a known circuit board and semiconductor chip that may be used for constituting the semiconductor device may be used. Alternatively, a lead frame may be used in place of the circuit board. For example, like the semiconductor device disclosed in JP-A-2002-246542, the semiconductor device may include a lead frame and a semiconductor chip mounted on the lead frame.

Examples of the semiconductor device include various semiconductor devices used for electric products (for example, a computer, a cellular telephone, a digital camera, a television, an air conditioner, a solar power generation system), vehicles (for example, a motorcycle, an automobile, an electric train, a ship, and an aircraft), and the like, and a semiconductor device for electric power (power semiconductor device) is especially preferred.

EXAMPLES

Aluminum having purity of 5N (99.999% by weight or more), and Sc, Zr, and Ni having purity of 99.9% by weight or more were molten as raw materials, and an Al ingot having a composition indicated in Table 1 was obtained. After the ingot was subjected to extrusion processing and swaging processing, the ingot was subjected to heat treatment at 580° C. for 2 hours, and further subjected to wire-drawing processing. At a stage where the wire diameter was 1 mm, solution heat treatment was performed at 580° C. for 1 hour, and rapid cooling (water cooling) was performed thereon. Thereafter, a wire drawing process using dies was performed to achieve a final wire diameter of 200 μm. After the wire-drawing processing ended, thermal refining heat treatment was performed so that the tensile strength becomes 120 MPa in a heat treatment time of 15 seconds, and thus obtaining the Al wiring material.

[Measurement of Element Content]

The content of Sc, Zr, Ni, and the like in the Al wiring material was measured by using ICP-OES ("PS3520UVDDII" manufactured by Hitachi High-Tech Corporation) or ICP-MS ("Agilent 7700x ICP-MS" manufactured by Agilent Technologies, Inc.) as an analysis device.

[Measurement of Vickers Hardness]

The Vickers hardness of the longitudinal axis part of the Al wiring material was measured by using a micro Vickers hardness tester ("HM-200" manufactured by Mitutoyo Corporation). The measurement target area was set to a cross section (L cross section) parallel with the longitudinal direction including the longitudinal axis of the Al wiring material, and hardness at the longitudinal axis part (that is, the center position of the Al wiring material) was measured. An average of measurement values at five points was employed as the Vickers hardness of the sample.

[Measurement of Average Crystal Grain Diameter at C Cross Section]

The average crystal grain diameter at the C cross section was measured by using an EBSD method (a measurement device: EBSD analysis system "AZtec HKL" manufactured by Oxford Instruments). Specifically, areas of respective crystal grains were obtained for the entire C cross section, the areas of the respective crystal grains were converted into areas of circles to calculate an average of diameters thereof, and the average was employed as the average crystal grain diameter. The area of each crystal grain was obtained while a position at which an orientation difference between adjacent measurement points was 15 degrees or more was defined as a grain boundary.

[Measurement of Mechanical Properties]

The breaking strength of the Al wiring material was measured by drawing the Al wiring material under the condition that a distance between gauge points is 100 mm, a drawing speed is 10 mm/minute, and a load cell rating load is 1 kN, by using a tensile testing machine manufactured by Instron. The measurement was performed five times, and an average value obtained therefrom was employed as the breaking strength of the sample.

[Evaluation of Wire Breakage Rate]

A wire breakage rate [number of times/km] was calculated by the expression: N/L, based on the number of times of wire breakage (N [number of times]) at the time of performing the wire drawing process using dies from a wire diameter of 1 mm to 200 μm, and a length (L [km]) of the Al wiring material (wire diameter: 200 μm) after the wire drawing process using dies.

In the semiconductor device, the electrode on the semiconductor chip was an Al—Cu pad, and Ag was used for an external terminal. A first connection part between the electrode on the semiconductor chip and the Al wiring material, and a second connection part between the external terminal and the Al wiring material were both wedge-bonded. After the connection, aging heat treatment was performed at 300° C. for 30 minutes.

[Evaluation of Chip Damage]

A chip crack in the semiconductor device was evaluated by dissolving metal on a pad surface by acid, and observing a part under the pad by a microscope (the number of evaluations N=50). In the "chip damage" column of Table 1, a case in which a crack, traces of bonding and the like were not found was determined to be excellent to be marked with a symbol of "double circle", a case in which there was no crack but traces of bonding were found at some spots (three spots or less of the number of evaluations 50) was marked with a symbol of "circle", and other cases were marked with a symbol of "cross".

[Evaluation of Thermal Shock Resistance]

Evaluation of thermal shock resistance was performed by power cycle test. In the power cycle test, heating and cooling are alternately and repeatedly performed on the semiconductor device connected to the Al wiring material. Heating is performed for 2 seconds until the temperature of the connection part of the Al wiring material in the semiconductor device reaches 120° C., and cooling is performed for 20 seconds until the temperature of the connection part reaches 30° C. thereafter. This heating-cooling cycle is repeated 100,000 times.

After the power cycle test described above, a bond shear force of the first connection part was measured, and reliability of the connection part was evaluated. The shear force was measured as comparison with an initial shear force of the connection part. In the "thermal shock test" column of Table 1, a case in which the shear force is 90% or more of the initial connection force was marked with a symbol of "double circle", a case in which the shear force is 80% or more was marked with a symbol of "circle", a case in which the shear force is 60% or more was marked with a symbol of "triangle", and a case in which the shear force is less than 60% was marked with a symbol of "cross".

Table 1 indicates manufacturing conditions and manufacturing results. In Table 1, an underline is added to numerical values representing the content of an added element deviating from the range of the present invention.

TABLE 1

| | No. | Component content | | | Aging processing | | Breaking strength (MPa) | Hardness (Hv) | Wire breakage rate (number of times/km) | Chip damage | Thermal shock test |
|---|---|---|---|---|---|---|---|---|---|---|---|
| | | Sc (wt. %) | Zr (wt. %) | Ni (wt. ppm) | Solution treatment | after bonding | | | | | |
| Working | 1 | 0.01 | 0.01 | — | Not performed | Performed | 72 | 22 | 0.01 | ◎ | ○ |
| Example | 2 | 0.01 | 0.13 | — | Not performed | Performed | 75 | 23 | 0.01 | ◎ | ◎ |
| | 3 | 0.02 | 0.16 | — | Performed | Performed | 74 | 21 | 0.01 | ○ | ◎ |

TABLE 1-continued

| | No. | Sc (wt. %) | Zr (wt. %) | Ni (wt. ppm) | Solution treatment | Aging processing after bonding | Breaking strength (MPa) | Hardness (Hv) | Wire breakage rate (number of times/km) | Chip damage | Thermal shock test |
|---|---|---|---|---|---|---|---|---|---|---|---|
| | 4 | 0.02 | 0.22 | — | Performed | Performed | 74 | 21 | 0.01 | ○ | ◎ |
| | 5 | 0.01 | 0.29 | — | Performed | Performed | 76 | 24 | 0.01 | ○ | ◎ |
| | 6 | 0.14 | 0.01 | — | Not performed | Performed | 79 | 23 | 0.01 | ◎ | ◎ |
| | 7 | 0.14 | 0.14 | — | Not performed | Performed | 77 | 24 | 0.01 | ◎ | ◎ |
| | 8 | 0.14 | 0.16 | — | Performed | Performed | 79 | 25 | 0.01 | ○ | ◎ |
| | 9 | 0.13 | 0.21 | — | Performed | Performed | 76 | 24 | 0.01 | ○ | ◎ |
| | 10 | 0.15 | 0.3 | — | Performed | Performed | 90 | 28 | 0.01 | ○ | ◎ |
| | 11 | 0.17 | 0.09 | — | Performed | Performed | 82 | 26 | 0.01 | ○ | ◎ |
| | 12 | 0.16 | 0.14 | — | Performed | Performed | 80 | 26 | 0.01 | ○ | ◎ |
| | 13 | 0.17 | 0.17 | — | Performed | Performed | 74 | 26 | 0.01 | ○ | ◎ |
| | 14 | 0.16 | 0.21 | — | Performed | Performed | 85 | 28 | 0.01 | ○ | ◎ |
| | 15 | 0.16 | 0.3 | — | Performed | Performed | 80 | 26 | 0.01 | ○ | ◎ |
| | 16 | 0.31 | 0.16 | — | Performed | Performed | 85 | 27 | 0.01 | ○ | ◎ |
| | 17 | 0.33 | 0.2 | — | Performed | Performed | 84 | 26 | 0.01 | ○ | ◎ |
| | 18 | 0.34 | 0.3 | — | Performed | Performed | 89 | 26 | 0.01 | ○ | ◎ |
| | 19 | 0.39 | 0.23 | — | Performed | Performed | 91 | 27 | 0.02 | ○ | ◎ |
| | 20 | 0.41 | 0.3 | — | Performed | Performed | 96 | 29 | 0.02 | ○ | ◎ |
| | 21 | 0.49 | 0.23 | — | Performed | Performed | 101 | 32 | 0.03 | ○ | ◎ |
| | 22 | 0.5 | 0.3 | — | Performed | Performed | 109 | 33 | 0.03 | ○ | ◎ |
| | 23 | 0.01 | 0.01 | 429 | Not performed | Performed | 120 | 35 | 0.04 | ◎ | ◎ |
| | 24 | 0.02 | 0.14 | 98 | Not performed | Performed | 80 | 24 | 0.02 | ◎ | ◎ |
| | 25 | 0.04 | 0.1 | 43 | Not performed | Performed | 79 | 23 | 0.01 | ◎ | ◎ |
| | 26 | 0.01 | 0.16 | 500 | Performed | Performed | 122 | 36 | 0.04 | ○ | ◎ |
| | 27 | 0.01 | 0.2 | 257 | Performed | Performed | 103 | 30 | 0.03 | ○ | ◎ |
| | 28 | 0.02 | 0.24 | 33 | Performed | Performed | 88 | 27 | 0.01 | ○ | ◎ |
| | 29 | 0.02 | 0.3 | 314 | Performed | Performed | 106 | 32 | 0.03 | ○ | ◎ |
| | 30 | 0.13 | 0.01 | 147 | Not performed | Performed | 91 | 27 | 0.02 | ◎ | ◎ |
| | 31 | 0.14 | 0.14 | 169 | Not performed | Performed | 94 | 28 | 0.02 | ◎ | ◎ |
| | 32 | 0.12 | 0.13 | 16 | Not performed | Performed | 80 | 24 | 0.01 | ◎ | ◎ |
| | 33 | 0.14 | 0.16 | 227 | Performed | Performed | 104 | 31 | 0.03 | ○ | ◎ |
| | 34 | 0.14 | 0.2 | 359 | Performed | Performed | 120 | 34 | 0.03 | ○ | ◎ |
| | 35 | 0.14 | 0.3 | 37 | Performed | Performed | 88 | 26 | 0.02 | ○ | ◎ |
| | 36 | 0.15 | 0.08 | 48 | Not performed | Performed | 85 | 26 | 0.01 | ◎ | ◎ |
| | 37 | 0.16 | 0.01 | 398 | Performed | Performed | 116 | 36 | 0.04 | ○ | ◎ |
| | 38 | 0.16 | 0.14 | 10 | Performed | Performed | 79 | 26 | 0.01 | ○ | ◎ |
| | 39 | 0.18 | 0.16 | 433 | Performed | Performed | 123 | 34 | 0.04 | ○ | ◎ |
| | 40 | 0.17 | 0.2 | 498 | Performed | Performed | 124 | 38 | 0.04 | ○ | ◎ |
| | 41 | 0.16 | 0.3 | 28 | Performed | Performed | 85 | 26 | 0.01 | ○ | ◎ |
| | 42 | 0.33 | 0.01 | 69 | Performed | Performed | 90 | 27 | 0.02 | ○ | ◎ |
| | 43 | 0.27 | 0.14 | 157 | Performed | Performed | 97 | 30 | 0.02 | ○ | ◎ |
| | 44 | 0.32 | 0.16 | 265 | Performed | Performed | 109 | 33 | 0.03 | ○ | ◎ |
| | 45 | 0.3 | 0.21 | 77 | Performed | Performed | 90 | 27 | 0.02 | ○ | ◎ |
| | 46 | 0.3 | 0.29 | 244 | Performed | Performed | 108 | 33 | 0.03 | ○ | ◎ |
| | 47 | 0.49 | 0.01 | 111 | Performed | Performed | 114 | 35 | 0.03 | ○ | ◎ |
| | 48 | 0.5 | 0.14 | 52 | Performed | Performed | 110 | 33 | 0.03 | ○ | ◎ |
| | 49 | 0.47 | 0.16 | 87 | Performed | Performed | 109 | 34 | 0.03 | ○ | ◎ |
| | 50 | 0.46 | 0.21 | 92 | Performed | Performed | 107 | 34 | 0.03 | ○ | ◎ |
| | 51 | 0.41 | 0.27 | 21 | Performed | Performed | 97 | 29 | 0.02 | ○ | ◎ |
| | 52 | 0.5 | 0.3 | 202 | Performed | Performed | 120 | 35 | 0.04 | ○ | ◎ |
| | 53 | 0.35 | 0.18 | 556 | Performed | Performed | 126 | 38 | 0.06 | ○ | ◎ |
| Comparative Example | 1 | 0.12 | — | 68 | Not performed | Performed | 82 | 25 | 0.02 | ◎ | X |
| | 2 | — | 0.07 | 44 | Not performed | Performed | 75 | 22 | 0.01 | ◎ | X |
| | 3 | 0.21 | 0.008 | 154 | Performed | Performed | 94 | 28 | 0.02 | ○ | X |
| | 4 | 0.007 | 0.11 | 313 | Not performed | Performed | 103 | 31 | 0.03 | ◎ | X |
| | 5 | 0.7 | 0.14 | 105 | Performed | Performed | 143 | 43 | 0.05 | X | ◎ |
| | 6 | 0.48 | 0.37 | 233 | Performed | Performed | 136 | 42 | 0.05 | X | ◎ |

Regarding all of Working Examples Nos. 1 to 53, the content of Sc and Zr falls within the range of the present invention, and all results of the wire breakage rate, the chip damage, and the thermal shock test were favorable. Each of Working Examples Nos. 1 to 9 corresponds to the first embodiment, each of Working Examples Nos. 10 to 22 corresponds to the third embodiment, each of Working Examples Nos. 23 to 35 corresponds to the second embodiment, and each of Working Examples Nos. 36 to 53 corresponds to the fourth embodiment. It was confirmed that, in Working Examples Nos. 10 to 20, and 22 corresponding to the third embodiment in which a Zr/Sc weight ratio exceeds 0.5, an extremely favorable result was obtained from the thermal shock test. In Working Example No. 53, the content of Ni deviated from the upper limit of the preferred range, and a value of the wire breakage rate was high as compared with the other Working Examples.

In Comparative Examples Nos. 1 and 2, only one of Sc and Zr was contained, and a result of the thermal shock test was "cross".

In Comparative Examples Nos. 3 and 4, the content of Sc or Zr deviated from the lower limit of the range of the present invention, and the result of the thermal shock test was "cross".

In Comparative Examples Nos. 5 and 6, the content of Sc or Zr deviated from the upper limit of the range of the present invention, and a result of chip damage was "cross".

The invention claimed is:

1. An Al wiring material containing Sc, Zr, and Ni so as to satisfy $0.01 \leq x1 \leq 0.5$, $0.01 \leq x2 \leq 0.3$, and $10 \leq x3 \leq 500$ where x1 is a content of Sc [% by weight], x2 is a content of Zr [% by weight], and x3 is a content of Ni [ppm by weight],
with the balance comprising 99.8% by weight or more Al, and
wherein a tensile strength of the Al wiring material is 140 MPa or less.

2. The Al wiring material according to claim 1, wherein x1 and x2 satisfy a relation of x2/x1>0.5.

3. The Al wiring material according to claim 1, wherein Vickers hardness of a longitudinal axis part of the Al wiring material is 40 Hv or less.

4. The Al wiring material according to claim 1, wherein the Al wiring material has been subjected to a thermal refining heat treatment at 580 to 640° C. for 30 seconds or less.

5. The Al wiring material according to claim 1, wherein the Al wiring material does not have a coating that contains a metal other than Al as a main component.

6. The Al wiring material according to claim 1, wherein the Al wiring material is a bonding wire.

7. The Al wiring material according to claim 1, wherein the Al wiring material is subjected to aging heat treatment at 250 to 400° C. for 30 to 60 minutes after being connected to a member to be connected.

8. A semiconductor device comprising the Al wiring material according to claim 1.

* * * * *